(12) United States Patent
Wittmann

(10) Patent No.: US 10,312,416 B2
(45) Date of Patent: Jun. 4, 2019

(54) RADIATION-EMITTING SEMICONDUCTOR DEVICE

(71) Applicant: OSRAM Opto Semiconductors GmbH, Regensburg (DE)

(72) Inventor: Michael Wittmann, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/090,028

(22) Filed: Apr. 4, 2016

(65) Prior Publication Data

US 2016/0218253 A1 Jul. 28, 2016

Related U.S. Application Data

(63) Continuation of application No. 13/636,048, filed as application No. PCT/EP2011/053103 on Mar. 2, 2011, now Pat. No. 9,337,397.

(30) Foreign Application Priority Data

Mar. 24, 2010 (DE) ........................ 10 2010 012 602

(51) Int. Cl.
*H01L 33/62* (2010.01)
*H01L 33/50* (2010.01)
(Continued)

(52) U.S. Cl.
CPC ........ *H01L 33/502* (2013.01); *H01L 25/0753* (2013.01); *H01L 33/486* (2013.01);
(Continued)

(58) Field of Classification Search
CPC ...................................................... H01L 33/50
See application file for complete search history.

(56) References Cited

U.S. PATENT DOCUMENTS 6,878,563 B2 4/2005 Bader et al.
7,265,392 B2 9/2007 Hahn et al.
(Continued)

FOREIGN PATENT DOCUMENTS

CN 1495922 A 5/2004
CN 1753966 A 3/2006
(Continued)

OTHER PUBLICATIONS

Taiwanese Examination Report dated May 14, 2014 from corresponding Taiwanese Patent Application No. 100107509 w/ English translation.
(Continued)

*Primary Examiner* — Trang Q Tran
(74) *Attorney, Agent, or Firm* — DLA Piper LLP (US)

(57) ABSTRACT

A radiation-emitting semiconductor device includes a housing body having a chip mounting area, a chip connection region, a radiation-emitting semiconductor chip, and a light-absorbing material, wherein the radiation-emitting semiconductor chip is fixed to the chip connection region, the chip connection region is covered with the light-absorbing material at selected locations at which the chip connection region is not covered by the radiation-emitting semiconductor chip, the radiation-emitting semiconductor chip is free of the light-absorbing material in selected locations, the housing body has a cavity in which the at least one radiation-emitting semiconductor chip is arranged, the chip mounting area is a surface of the housing body which abuts the cavity, and the chip mounting area is free of the light-absorbing material in selected locations remote from the chip connection region.

16 Claims, 10 Drawing Sheets

(51) Int. Cl.
  *H01L 25/075*  (2006.01)
  *H01L 33/48*   (2010.01)
  *H01L 33/54*   (2010.01)
  *H01L 33/56*   (2010.01)

(52) U.S. Cl.
  CPC .............. *H01L 33/50* (2013.01); *H01L 33/54* (2013.01); *H01L 33/56* (2013.01); *H01L 33/62* (2013.01); *H01L 2224/48097* (2013.01); *H01L 2933/005* (2013.01); *H01L 2933/0041* (2013.01); *H01L 2933/0066* (2013.01)

(56) References Cited

U.S. PATENT DOCUMENTS

| | | | |
|---|---|---|---|
| 2001/0030511 A1* | 10/2001 | Yamazaki | G09G 3/3258 315/160 |
| 2007/0034772 A1 | 2/2007 | Webster et al. | |
| 2009/0226631 A1 | 9/2009 | Yamazaki et al. | |
| 2011/0121336 A1 | 5/2011 | Bogner et al. | |

FOREIGN PATENT DOCUMENTS

| | | |
|---|---|---|
| CN | 101378103 A | 3/2009 |
| DE | 10 2007 029 369 A1 | 1/2009 |
| DE | 10 2007 060 206 A1 | 6/2009 |
| EP | 1 609 835 A1 | 12/2005 |
| JP | 2001-150720 | 6/2001 |
| TW | 200941790 A1 | 10/2009 |

OTHER PUBLICATIONS

Notice of Allowance dated Aug. 31, 2017, of corresponding Korean Application No. 10-2012-7027781, along with an English translation.

First Office Action dated Nov. 30, 2017, from corresponding to Chinese Application No. 201610415644.6 in German, along with an English translation.

Third Office Action dated Nov. 13, 2018, of counterpart Chinese Application No. 201610415644.6, along with an English translation.

Second Office Action dated Jun. 6, 2018, of counterpart Chinese Application No. 201610415644.6, along with an English translation.

* cited by examiner

RADIATION-EMITTING SEMICONDUCTOR DEVICE

RELATED APPLICATIONS

This is a continuation of U.S. Ser. No. 13/636,048, filed Sep. 19, 2012, which is a § 371 of International Application No. PCT/EP2011/053103, with an international filing date of Mar. 2, 2011, which is based on German Patent Application No. 10 2010 012 602.0, filed Mar. 24, 2010, the subject matter of which is incorporated by reference.

TECHNICAL FIELD

This disclosure relates to a radiation-emitting semiconductor device and display apparatus, particularly a radiation-emitting semiconductor device having particularly diverse uses.

SUMMARY

I provide a radiation-emitting semiconductor device including a chip connection region, a radiation-emitting semiconductor chip, and a light-absorbing material, wherein the radiation-emitting semiconductor chip is fixed to the chip connection region, the chip connection region is covered with the light-absorbing material at selected locations at which the chip connection region is not covered by the radiation-emitting semiconductor chip, and the radiation-emitting semiconductor chip is free of the light-absorbing material in locations.

I also provide display apparatus comprising at least one pixel formed at least partly by a radiation-emitting semiconductor device.

I further provide a radiation-emitting semiconductor device including a chip connection region, a radiation-emitting semiconductor chip, a housing body having a chip mounting area, and a light-absorbing material, wherein the radiation-emitting semiconductor chip is fixed to the chip connection region, the chip connection region is covered with the light-absorbing material at locations at which the chip connection region is not covered by the radiation-emitting semiconductor chip, the radiation-emitting semiconductor chip is free of the light-absorbing material in selected locations, the chip connection region and/or a wire connection region are arranged at the chip mounting area, the chip mounting area is free of the light-absorbing material in selected locations, and the chip mounting area is formed with the same color as, or in a similar color to, the light absorbing material.

I further yet provide a radiation-emitting semiconductor device including a housing body having a chip mounting area, a chip connection region, a radiation-emitting semiconductor chip, and a light-absorbing material, wherein the radiation-emitting semiconductor chip is fixed to the chip connection region, the chip connection region is covered with the light-absorbing material at selected locations at which the chip connection region is not covered by the radiation-emitting semiconductor chip, the radiation-emitting semiconductor chip is free of the light-absorbing material in selected locations, the housing body has a cavity in which the at least one radiation-emitting semiconductor chip is arranged, the chip mounting area is a surface of the housing body which abuts the cavity, and the chip mounting area is free of the light-absorbing material in selected locations which are remote from the chip connection region.

I also further provide a method of producing the device including a housing body having a chip mounting area, a chip connection region, a radiation-emitting semiconductor chip, and a light-absorbing material, wherein the radiation-emitting semiconductor chip is fixed to the chip connection region, the chip connection region is covered with the light-absorbing material at selected locations at which the chip connection region is not covered by the radiation-emitting semiconductor chip, the radiation-emitting semiconductor chip is free of the light-absorbing material in selected locations, the housing body has a cavity in which the at least one radiation-emitting semiconductor chip is arranged, the chip mounting area is a surface of the housing body which abuts the cavity, and the chip mounting area is free of the light-absorbing material in selected locations which are remote from the chip connection region, including applying the light-absorbing material by a jet process.

DETAILED DESCRIPTION

Figure 1A:
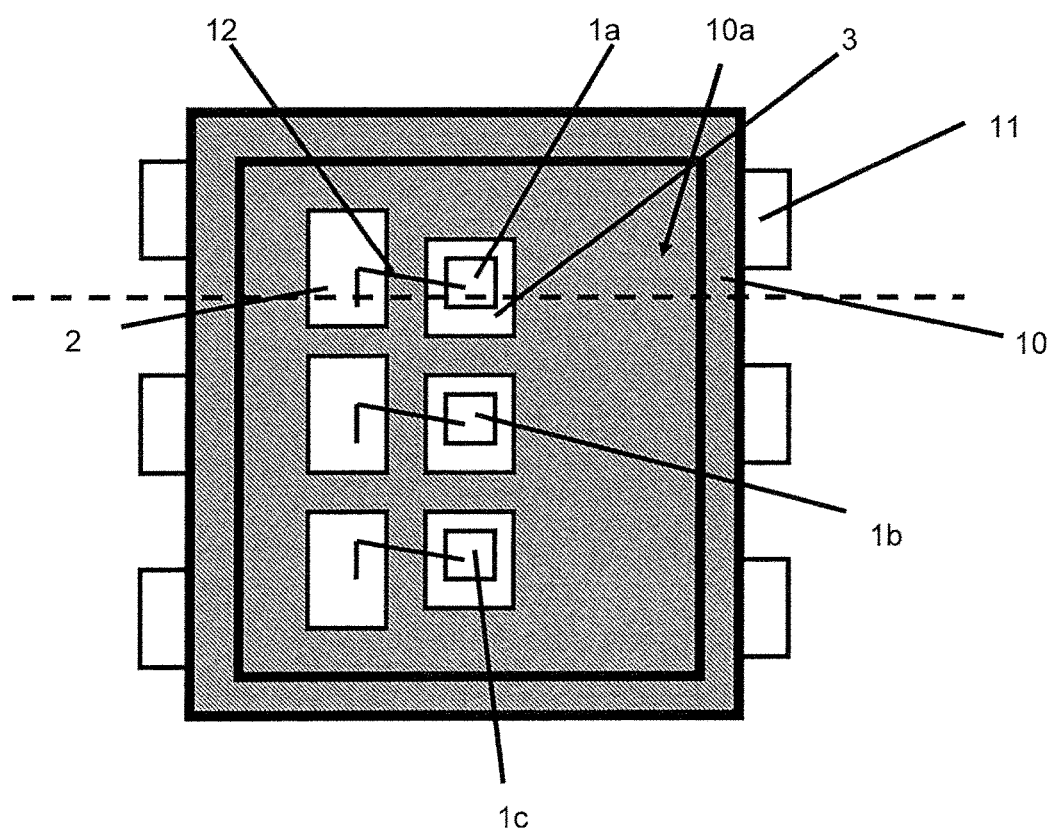
FIGS. 1A and 1B show schematic views of a radiation-emitting semiconductor device without a light-absorbing material.

The semiconductor device may comprise a chip connection region. The chip connection region is a region provided for mounting at least one radiation-emitting semiconductor chip on the chip connection region. By way of example, the chip connection region is formed by metallization or with a metal body. In particular, the chip connection region has a higher reflectivity for visible light than regions of the radiation-emitting semiconductor device which surround it.

The radiation-emitting semiconductor device may comprise a radiation-emitting semiconductor chip. The radiation-emitting semiconductor chip is a semiconductor chip which emits electromagnetic radiation in the wavelength range between infrared radiation and UV radiation during operation. By way of example, the radiation-emitting semiconductor chip emits visible light during operation. The radiation-emitting semiconductor chip is a luminescence diode chip, for example, that is to say a laser diode chip or a light-emitting diode chip.

The radiation-emitting semiconductor device may comprise a light-absorbing material. The light-absorbing material is provided to absorb at least part of the electromagnetic radiation in the visible range that impinges on the light-absorbing material. For example, at most 25% of the light in the visible range that impinges on the outer area of the light-absorbing material is reflected or re-emitted. Preferably at most 15%, particularly preferably at most 5%, of the impinging light in the visible range is reflected. By way of example, the light-absorbing material is black.

The radiation-emitting semiconductor chip may be fixed to the chip connection region. In this case, the radiation-emitting semiconductor chip can also be electrically contact-connected at the chip connection region. Furthermore, it is possible for a plurality of radiation-emitting semiconductor chips to be fixed on a chip connection region. The base area of the chip connection region is preferably chosen such that the radiation-emitting semiconductor chip or the radiation-emitting semiconductor chips in total have a cross-sectional area smaller than the base area such that the radiation-emitting semiconductor chip or chips does or do not completely cover the chip connection region. This proves to be advantageous, in particular, since, in this way, the radiation-emitting semiconductor chip can be positioned on the chip connection region with a certain tolerance.

The chip connection region may be covered with the light-absorbing material at locations at which it is not covered by the radiation-emitting semiconductor chip. That is to say that regions of the chip connection region which would be exposed because the radiation-emitting semiconductor chip does not cover them are partly or completely covered with the light-absorbing material.

The radiation-emitting semiconductor chip may be free of the light-absorbing material in selected locations. That is to say that the radiation-emitting semiconductor chip is not completely covered by the light-absorbing material rather, for example, at least that surface of the radiation-emitting semiconductor chip which is remote from the chip connection region remains completely or partly free of the light-absorbing material. By way of example, the light-absorbing material, at side areas of the radiation-emitting semiconductor chip, can directly adjoin the latter.

The radiation-emitting semiconductor device may comprise a chip connection region, a radiation-emitting semiconductor chip fixed to the chip connection region, and a light-absorbing material which covers the chip connection region at locations at which it is not covered by the radiation-emitting semiconductor chip, wherein the radiation-emitting semiconductor chip is free of the light-absorbing material in locations.

In particular, it is possible that the light-absorbing material is applied to the chip connection region after the chip has been fixed to the chip connection region. For example, a side surface of the chip can be covered with the light-absorbing material.

The radiation-emitting semiconductor device may comprise a wire connection region. The wire connection region is formed by metallization or with a metal body, for example. In particular, the wire connection region differs from the material surrounding it by virtue of its higher reflectivity for visible light.

The radiation-emitting semiconductor device may comprise a wire which electrically conductively connects the wire connection region to the radiation-emitting semiconductor chip. By way of example, the radiation-emitting semiconductor chip is then electrically conductively contact-connected first via the chip connection region and second via the wire.

The wire connection region may be covered with the light-absorbing material at locations at which it is not covered by the wire. That is to say that, for example, light-reflecting regions of the wire connection region which, without the light-absorbing material, would be freely accessible and light-reflecting are covered with the light-absorbing material. In this case, it is possible for parts of the wire also to be covered with the light-absorbing material. In an extreme case, the entire wire can be covered with the light-absorbing material.

The radiation-emitting semiconductor device may comprise a single chip connection region, a single radiation-emitting semiconductor chip and a single wire connection region. The radiation-emitting semiconductor chip can then be a radiation-emitting semiconductor chip which emits, for example, infrared radiation, colored visible light or white light.

The radiation-emitting semiconductor device may comprise two chip connection regions, a single radiation-emitting semiconductor chip and no wire connection region. The radiation-emitting semiconductor chip can then be a radiation-emitting semiconductor chip which emits, for example, infrared radiation, colored visible light or white light.

The radiation-emitting semiconductor device may comprise at least two radiation-emitting semiconductor chips. By way of example, the radiation-emitting semiconductor device can then be a semiconductor device which comprises a semiconductor chip which emits red light, a semiconductor chip which emits blue light and a semiconductor chip which emits green light. Each of the semiconductor chips can be electrically contact-connected by, respectively, two chip connection regions or, respectively, two wire connection regions or by, respectively, one chip connection region and one wire connection region.

Independently of how many chip connection regions, radiation-emitting semiconductor chips and wire connection regions the radiation-emitting semiconductor device comprises, the wire connection regions and chip connection regions present are covered with the light-absorbing material at locations at which they are not covered by other components of the semiconductor device. In this case, the light-absorbing material can be applied in a targeted manner where it covers a connection region. Furthermore, it is possible for the light-absorbing material to be applied areally such that it is present, for example, as a single continuous body, covering all exposed locations of the connection regions, in the radiation-emitting semiconductor device.

The radiation-emitting semiconductor device may comprise a housing body having a chip mounting area. By way of example, the housing body can have a cavity in which the at least one radiation-emitting semiconductor chip is arranged. The chip mounting area of the housing body is then formed by the chip mounting area of the cavity. However, it is also possible for the housing body to be a parallelepipedal plate that is free of cutouts or cavities in which radiation-emitting semiconductor chips are arranged. In an extreme case, the housing body can be a printed circuit board wherein the chip mounting area of the housing body is arranged at the side at which the radiation-emitting semiconductor chip is also mounted.

In this case, the chip connection region and/or the wire connection region are arranged at the chip mounting area of the housing body. The chip mounting area is thus free of light-absorbing material in selected locations. In other words, the entire chip mounting area may not be covered with the light-absorbing material, rather the light-absorbing material is arranged, for example, only at those locations at which an increased reflection of light occurs such as in the chip connection region and/or in the wire connection region. In this way, relatively little light-absorbing material is required.

By way of example, the metal or the metals forming the chip connection region and the wire connection region is or are covered with the light-absorbing material. The rest of the chip mounting area is then free of the light-absorbing material. For example, at least 50% of the chip mounting area is free of the light-absorbing material. In this case, it is possible, in particular, for the chip mounting area have the same color as, or in a similar color to, the light-absorbing material. In this case, the entire housing body can also have the same color as, or a similar color to, the light-absorbing material. In a view of the semiconductor device, the semiconductor device, apart from the radiation exit areas of the semiconductor chips, then appears in uniform color. There are no disturbing reflections, for example, as a result of metallizations at the chip mounting area which can disturb the contrast with respect to the semiconductor chips.

The chip mounting area may be completely covered by the light-absorbing material. That is to say, in particular, the light absorbing material is also situated on regions of the chip mounting area which are at a distance from the chip connection region and/or from the wire connection region. In this case, application of the light-absorbing material is particularly simple since the light-absorbing material does not have to be deposited in a targeted manner in the region of the connection regions.

The radiation-emitting semiconductor device may comprise a light-transmissive potting material. The light-transmissive potting material is substantially free of the light-absorbing material. In this case, the light-absorbing potting material can be transparent. Furthermore, it is possible for the light-transmissive potting material to be filled with a phosphor and/or with a diffuser. The phosphor can be, for example, particles of a luminescence conversion material which, for example, absorbs blue light or UV radiation and re-emits radiation having higher wavelengths. The diffuser material can be, for example, particles of, in particular, a ceramic material which are suitable for scattering light.

The fact that the potting material is substantially free of the light-absorbing material means that the light-absorbing material or the light-absorbing constituent of the light-absorbing material such as light-absorbing particles, for example, is not introduced into the potting material in a targeted manner. As a result of diffusion processes at the interface between potting material and light-absorbing material, however, it can happen that small portions of the light-absorbing material diffuse into the light-transmissive potting material. Preferably, the proportion by weight, for example, of radiation-absorbing particles of the light-absorbing material in the light-transmissive potting material is at most 1%.

In this case, the potting material is arranged in the radiation-emitting semiconductor device such that it adjoins the light-absorbing material in locations. That is to say that the light-transmissive potting material completely covers the exposed outer areas of the light-absorbing material, for example, and thus encapsulates the light-absorbing material towards the outside.

The housing body and the light-absorbing material may be in the same color. By way of example, both the housing body and the light-absorbing material may be black.

The chip connection region and/or the wire connection region may be formed with a metal such as silver, for example. In this case, the connection regions can be formed by metallization. Metallization is applied to a material of the housing body, for example. For this purpose, the housing body can be formed with a plastic material and/or with a ceramic material. However, it is also possible for the metallization to be applied to a metallic leadframe, which is formed with copper, for example. Furthermore, it is possible for the connection regions to be parts of such an electrical leadframe which are not provided with additional metallization.

The light-absorbing material may inhibit migration of the metal, that is to say, for example, of the silver, of the connection regions. For this purpose, for example, light-absorbing particles of the light-absorbing material can inhibit migration in particular in the electric field of, for example, ions of the metal or of the silver by the particles. Furthermore, it is possible for the light-absorbing material to comprise further fillers which inhibit the migration in the electric field. The fillers can be, for example, particles of a ceramic material or particles composed of titanium dioxide.

Particularly if the chip connection region and/or the wire connection region are/is formed with a metal such as silver, a further advantage that arises is that possible oxidation or corrosion of the metal of the connection regions or of the connection region, after the exposed locations of the connection regions have been covered by the light-absorbing material, is externally no longer discernable or is preventable. That is to say that it is also possible for the light-absorbing material to inhibit, delay or prevent oxidation and/or corrosion of the metal of the connection regions or of the connection region.

The light-absorbing material may be applied by a jet process. Furthermore, it is possible for the light-absorbing material to be applied by a molding process, by selective deposition (for example, by a plasma spraying process), by screen printing, by sputtering or by spraying. In this case, the individual application processes are distinguishable from one another on the finished product. Therefore, these application processes for the light-absorbing material are substantive features which can be demonstrated on the finished radiation-emitting semiconductor device.

The light-absorbing material may comprise a silicone into which light-absorbing particles are introduced. The light-absorbing particles can be carbon black particles, for example. The carbon black is preferably amorphous carbon black. The proportion of the absorber (for example, the carbon black particles) in the matrix material (for example, the silicone) of the radiation-emitting semiconductor device is preferably between at least 7% by weight and at most 13% by weight, for example, 10% by weight.

For a viscous material such as silicone, for example, a jet process constitutes a particularly suitable method of applying the light-absorbing material.

The radiation-emitting semiconductor device is particularly well suited to use in so-called "video walls" wherein individual pixels are formed by radiation-emitting semiconductor chips of the radiation-emitting semiconductor device. The radiation-emitting semiconductor device is distinguished by the high contrast between switched-on and switched-off states of the radiation-emitting semiconductor device. By virtue of the covering of the bright regions in the radiation-emitting semiconductor device such as the connection regions, for example, with the light-absorbing material, a radiation-emitting semiconductor device arises which, in the switched-off state, appears fully black, for example, in plan view. By virtue of the fact that the radiation-emitting semiconductor chip remains free of the light-absorbing material in locations, it is possible to achieve a high brightness of the light emitted by the radiation-emitting semiconductor device or of the electromagnetic radiation emitted by the radiation-emitting semiconductor device.

Furthermore, a display apparatus is specified, wherein pixels of the display apparatus are formed by the radiation-emitting semiconductor devices. The display apparatus is, for example, a large-area video wall having a display area of at least 5 m$^2$.

The radiation-emitting semiconductor device will be explained in greater detail below on the basis of examples and with reference to the associated figures.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size to enable better illustration and/or to afford a better understanding.

Figure 1B:
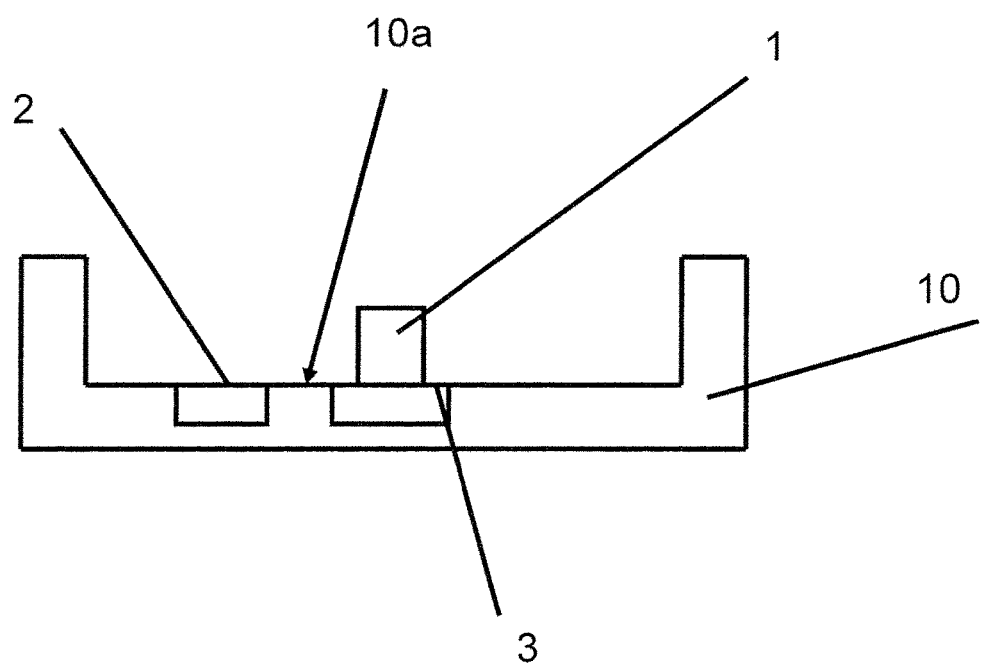

FIG. 1A shows a schematic plan view of a radiation-emitting semiconductor device without the light-absorbing material. FIG. 1B shows the associated sectional illustration along the dashed line depicted in FIG. 1A.

In this case, the radiation-emitting semiconductor device comprises a housing body 10 formed with a plastic material or with a ceramic material, for example. The housing body 10 is black in this case.

Electrical connection locations 11, via which radiation-emitting semiconductor chips 1a, 1b, 1c of the radiation-emitting semiconductor device can be electrically contact-connected, project laterally from the housing body 10. The electrical connection locations 11 are, for example, parts of an electrical leadframe exposed in the housing body 10 at the chip mounting area 10a thereof, where they form wire connection regions 2 and chip connection regions 3. The electrical connection locations 11 can be formed with a metal such as copper, which, if appropriate, is coated with a further metal such as silver or gold, at least in selected locations.

Radiation-emitting semiconductor chips 1a, 1b, 1c are applied to the chip connection regions 3. In this case, the radiation-emitting semiconductor device comprises three different radiation-emitting semiconductor chips. However, it is also possible for the radiation-emitting semiconductor device to comprise more or fewer radiation-emitting semiconductor chips. In this case, the radiation-emitting semiconductor device comprises one radiation-emitting semiconductor chip 1a which emits red light, one radiation-emitting semiconductor chip 1b which emits green light, and one radiation-emitting semiconductor chip 1c which emits blue light. The radiation-emitting semiconductor chips 1a, 1b, 1c are in each case electrically conductively connected to associated wire connection regions 2 by a wire 12.

The radiation-emitting semiconductor chips are light-emitting diode chips, for example. Such a radiation-emitting semiconductor device can form, for example, a pixel of a display apparatus whose pixels are provided by a multiplicity of radiation-emitting semiconductor devices embodied in an identical fashion.

On account of their metallic reflectivity, the connection regions 2, 3 have a higher reflectivity than the housing body 10, which is black, for example. This can prove to be disturbing during the use of the radiation-emitting semiconductor device.

Figure 2:
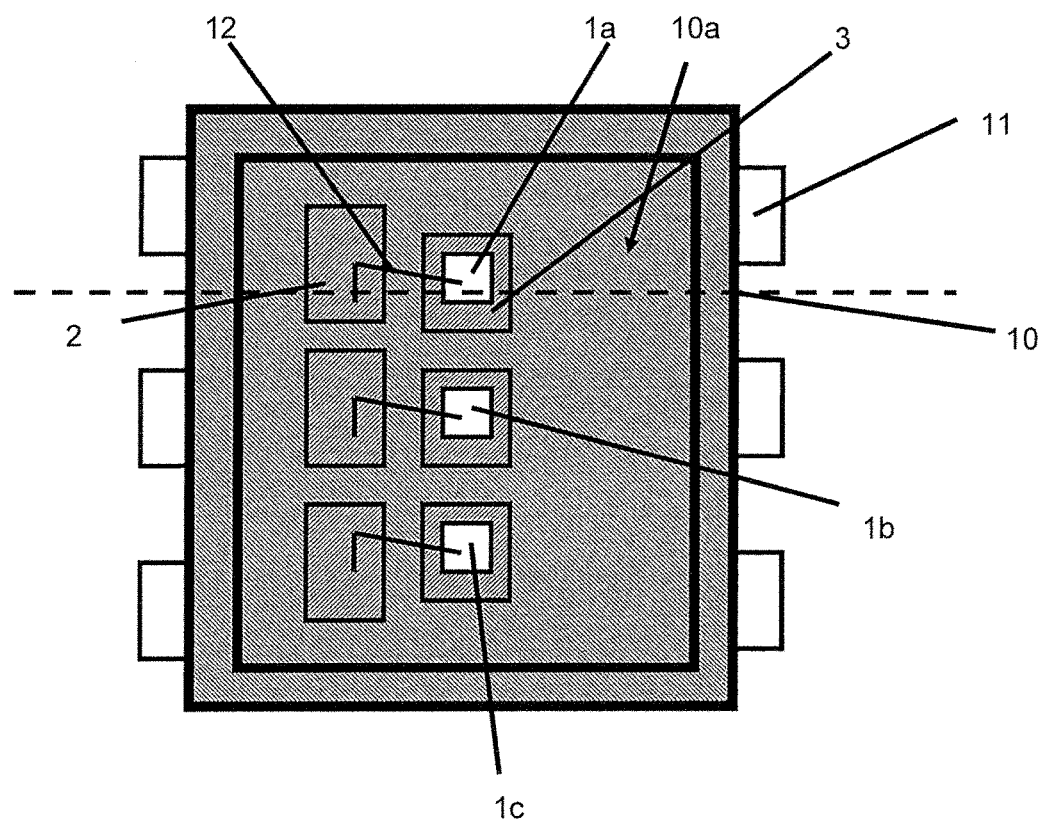
FIGS. 2, 3A, 3B, 3C, 4A, 4B, 4C, 5, 6 and 7 show schematic illustrations of examples of a radiation-emitting semiconductor device.

One example of a radiation-emitting semiconductor device is explained in greater detail with reference to the schematic plan view in FIG. 2. In contrast to the example described in conjunction with FIGS. 1A and 1B, the exposed locations of the wire connection regions 2 and the chip connection regions 3 are covered with a light-absorbing material 4 (in this respect, also cf. FIGS. 3A, 3B, 3C, 4A and 4B).

The light-absorbing material 4 preferably has the same color as, or a similar color to, the chip mounting area 10a of the housing body 10 or the housing body 10. The light-absorbing material is a silicone, for example, into which light-absorbing particles are introduced. By way of example, the light-absorbing particles are carbon black particles.

Figure 3A:
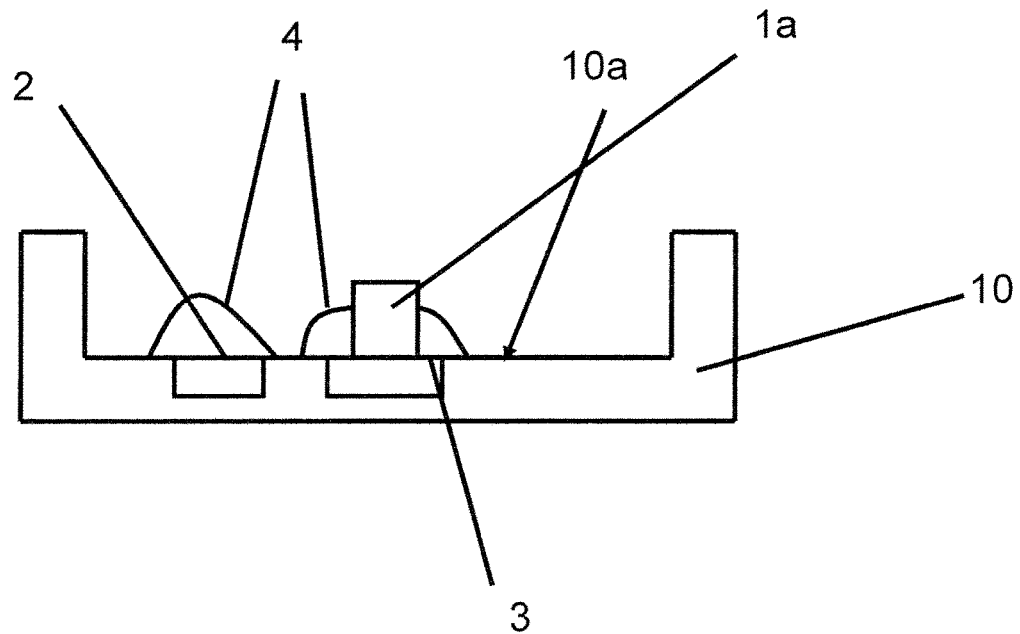

One possibility for introducing the light-absorbing material 4 is illustrated in greater detail in conjunction with the schematic sectional illustration in FIG. 3A. In this example, the light-absorbing material 4 is applied in a targeted manner in the region of the wire connection regions 2 and of the chip connection regions 3. The remaining chip mounting area 10a that is at a distance from the connection regions 2, 3 remains uncovered by the light-absorbing material 4. In this case, it is itself the same color as, or in a similar color to, the light-absorbing material such that from some distance, for example, at a distance starting from 10 cm from the observer's eye, externally it can no longer be discerned that parts of the chip mounting area 10a are not covered with the light-absorbing material 4. In this case, the light-absorbing material 4 is in direct contact with side areas of the radiation-emitting semiconductor chip 1a. This can be implemented in the same way for all the radiation-emitting semiconductor chips of the semiconductor device.

That surface of the radiation-emitting semiconductor chips 1a, 1b, 1c which is remote from the chip mounting area 10a then remains free or substantially free of the light-absorbing material 4.

Figure 3B:
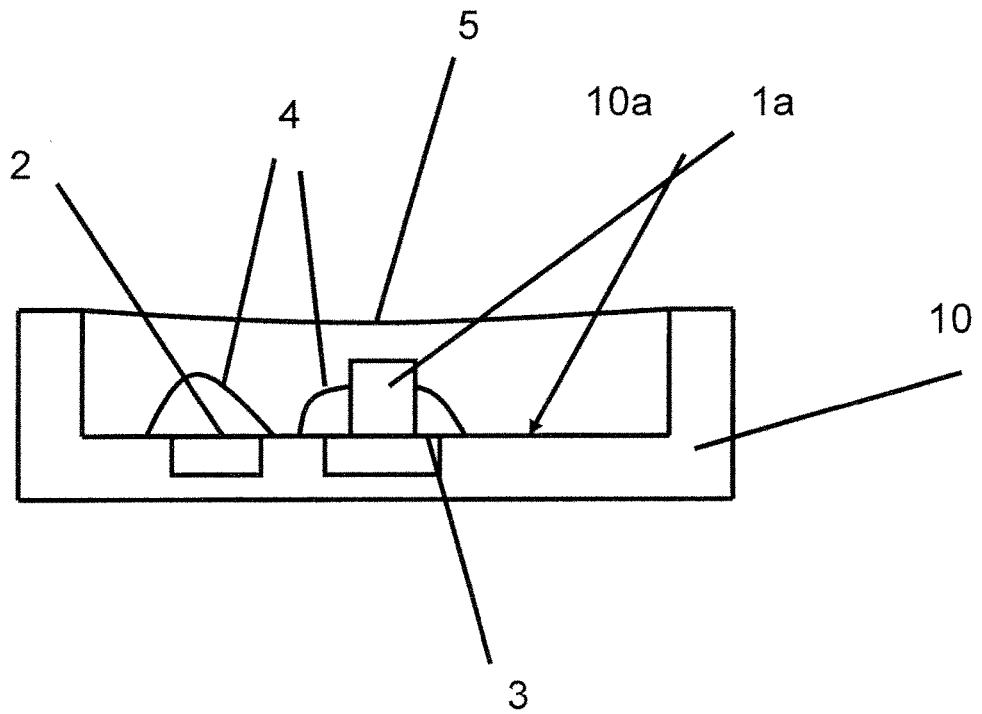

In the example in FIG. 3B, in addition to the light-absorbing material 4, a transmissive potting material 5 is applied to the chip mounting area 10a, which potting material, is in direct contact with the chip mounting area 10a in locations. The light-transmissive potting material 5 is, for example, a potting material which contains silicone or consists of silicone. The potting material is in direct contact with exposed outer areas of the light-absorbing material 4 in locations. The light-transmissive potting material is preferably free of, for example, the light-absorbing particles of the light-absorbing material 4.

Figure 3C:
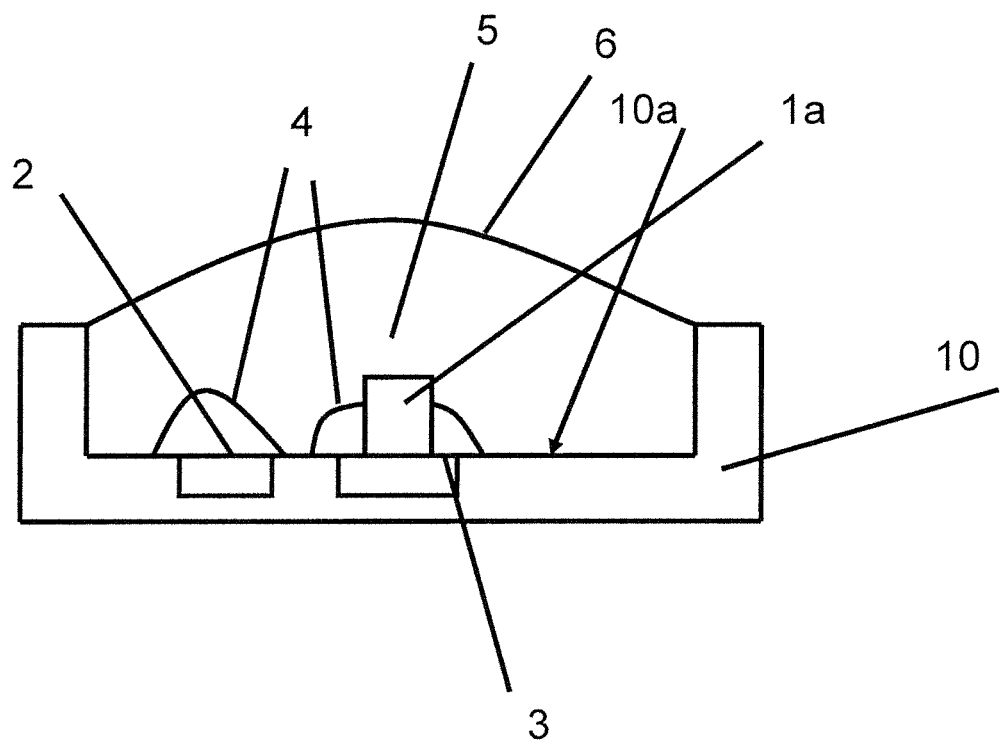

In the example described in conjunction with FIG. 3C, the potting material 5 is curved convexly outwards at its top side remote from the chip mounting area 10a and in this way forms a lens. In the example explained in conjunction with FIG. 4A, the light-absorbing material 4 completely covers the chip mounting area 10a. It is thus possible for the chip mounting area 10a to be in a different color, for example, white, with respect to the light-absorbing material. However, the light-absorbing material 4 is preferably the same color as the outer areas of the housing body 10 that are visible in plan view. The outer areas can be printed with a black color, for example.

Figure 4A:
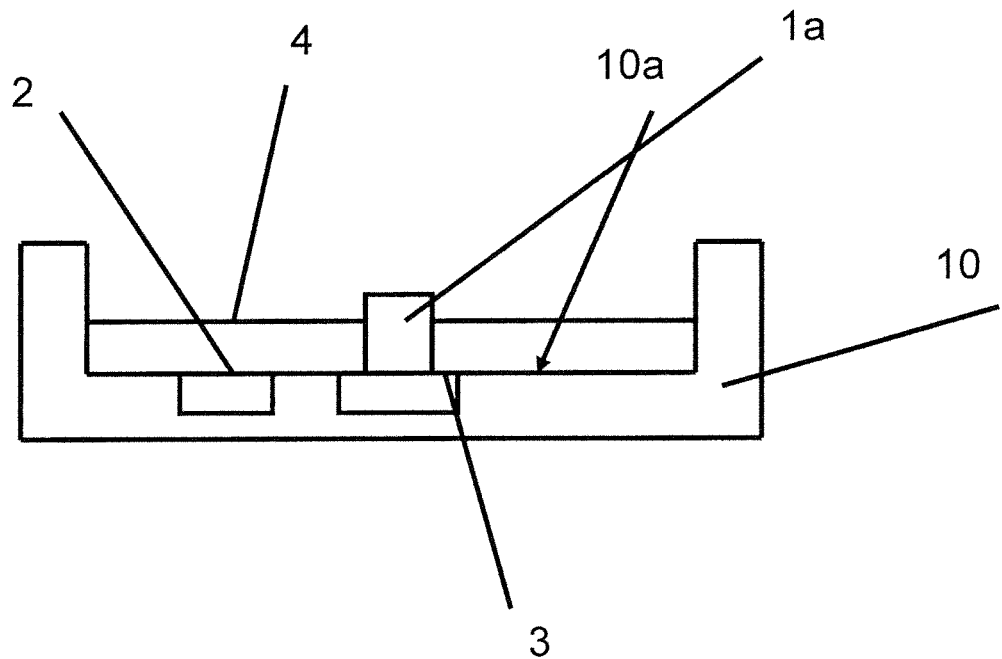
Figure 4B:
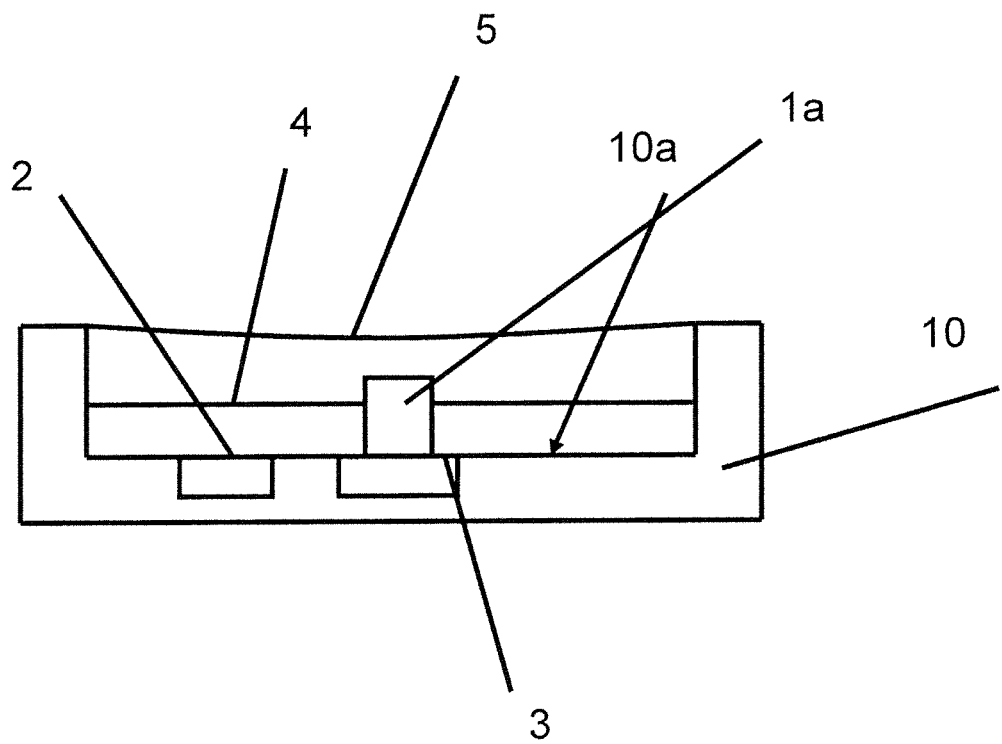
Figure 4C:
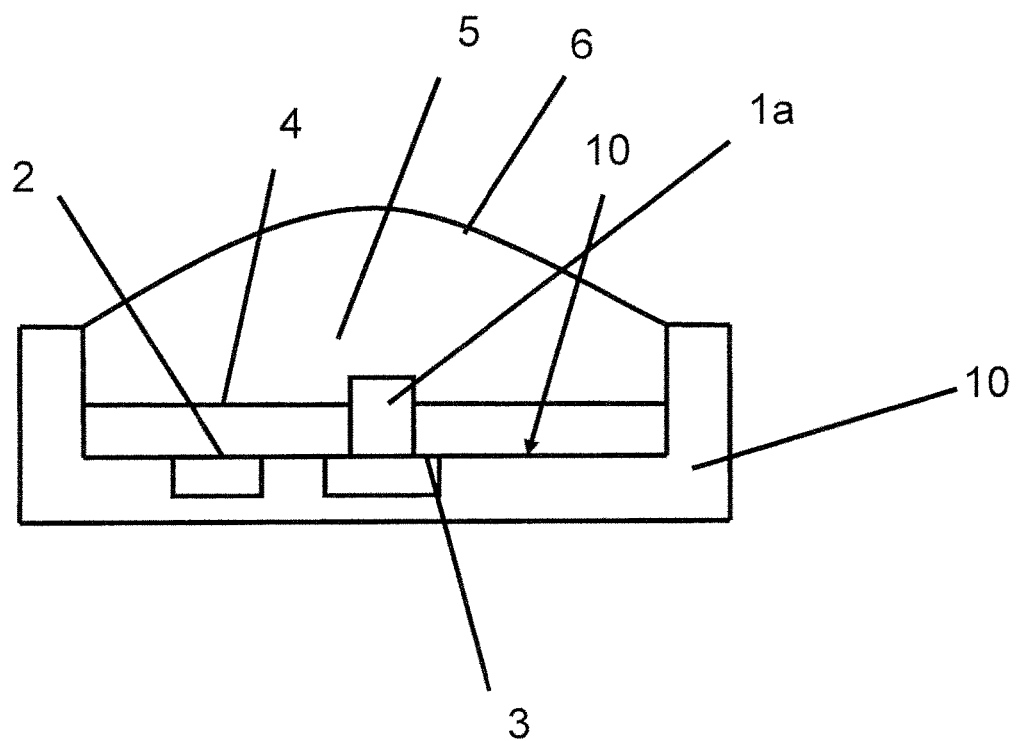

As is evident in conjunction with FIG. 4B, the light-transmissive potting material 5 in this case, too, can directly adjoin the light-absorbing material 4 and the radiation-emitting semiconductor chip or chips 1a, 1b, 1c and can be in direct contact with these components. A lens-like configuration of the top side of the light-transmissive potting material 5 that is remote from the chip mounting area 10a is also possible (see FIG. 4C).

A further example of a radiation-emitting semiconductor device is explained in greater detail with reference to the schematic plan view in FIG. 5. In contrast to the example explained in conjunction with FIG. 2, the semiconductor device in this example comprises two wire connection regions 2 for each of the radiation-emitting semiconductor chips 1a, 1b, 1c. That is to say that each of the radiation-emitting semiconductor chips 1a, 1b, 1c comprises two top-side contact locations (not illustrated), via which it is electrically conductively connected in each case to a wire connection region 2 by a wire 12. In this case, as described, for example, in conjunction with FIGS. 3A, 3B, 3C, 4A, 4B and 4C, the wire connection regions 2 are covered with the light-absorbing material 4 at exposed locations.

Figure 5:
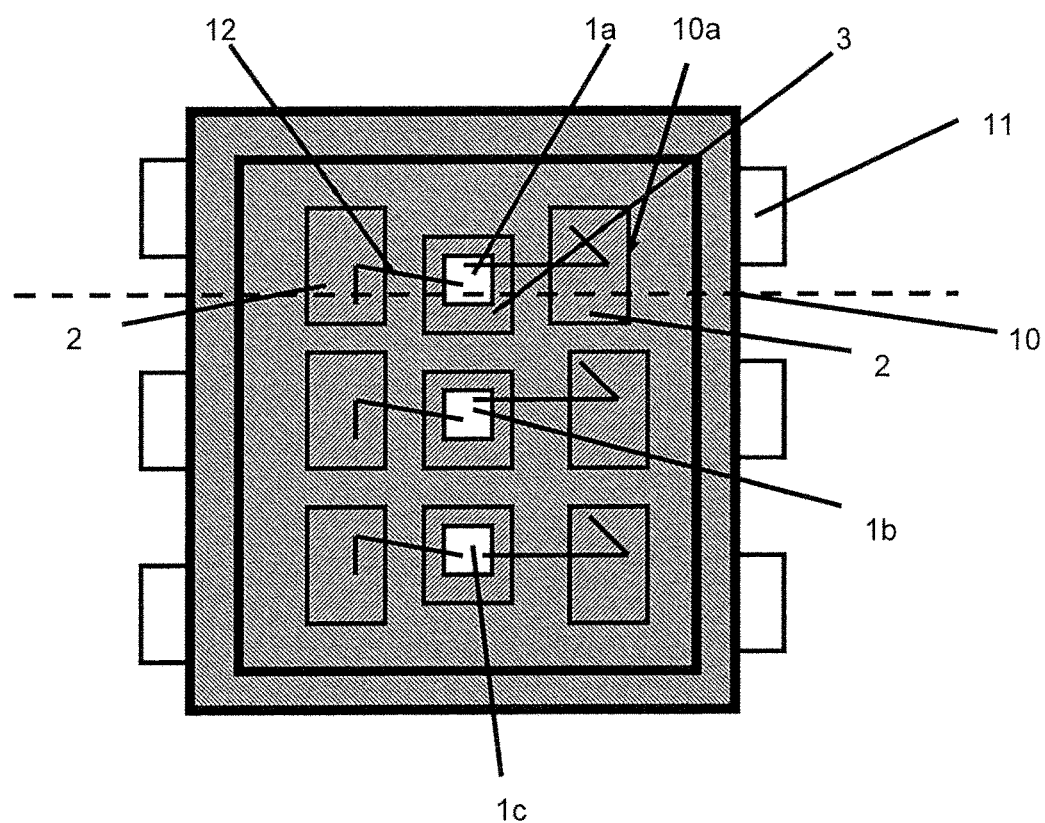

In the case of the example described in conjunction with FIG. 5, the radiation-emitting semiconductor chips 1a, 1b, 1c can comprise, in particular, a carrier element or a growth substrate formed with an electrically insulating material such as sapphire or SiC.

In the example in FIG. 5, the chip connection region 3 does not have to be formed with a reflective material such as, for example, a metal. In particular, it is possible that covering of exposed locations of the chip connection regions 3 is not necessary in the example in FIG. 5. In this case, it is also possible for just the exposed locations of the wire connection regions 2 to be covered.

Figure 6:
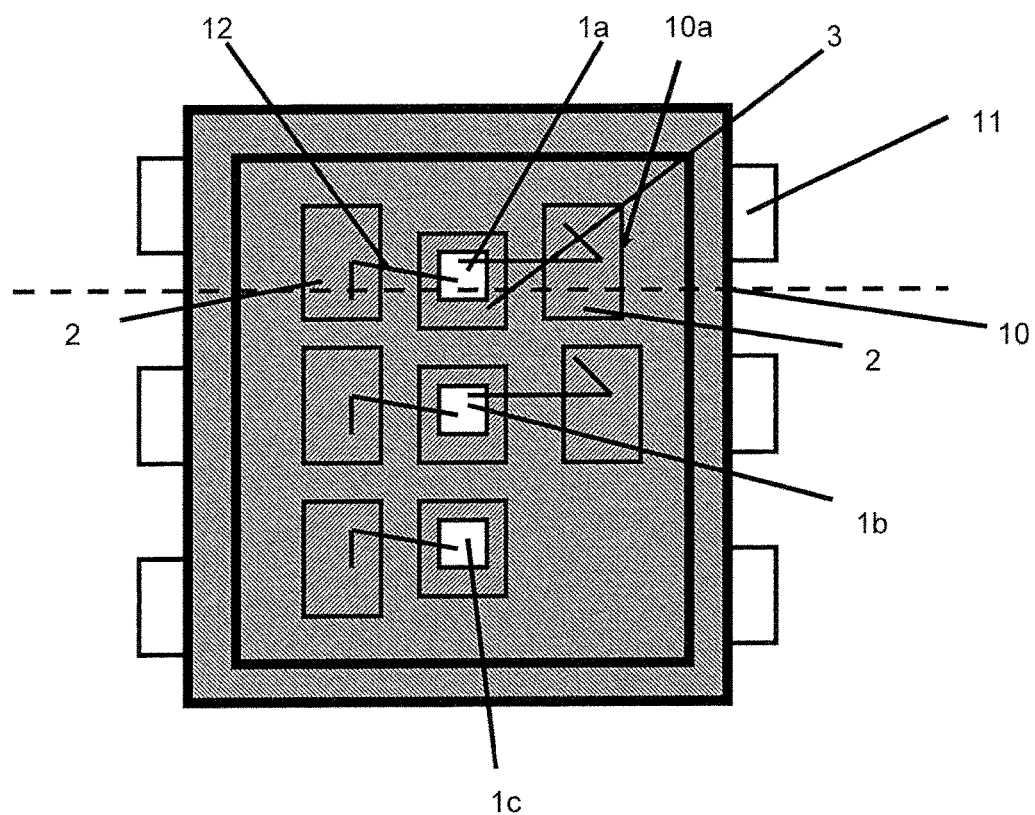

A further example of a radiation-emitting semiconductor device is explained in greater detail in conjunction with FIG. 6. In contrast to the example in FIG. 5, in this example only two of the radiation-emitting semiconductor chips 1a, 1b comprise two wire connection regions 2, wherein the third radiation-emitting semiconductor chip 1c is assigned a single wire connection region 2.

In other words, in this case, different types of radiation-emitting semiconductor chips can also be used, wherein the chips can be contact-connected differently from one another. By way of example, at least one of the radiation-emitting semiconductor chips can have a rear-side and a front-side contact such as the radiation-emitting semiconductor chip 1c in FIG. 6, and at least one of the radiation-emitting semiconductor chips can have only front-side or only rear-side contacts such as, for example, the radiation-emitting semiconductor chips 1a, 1b in FIG. 6.

Figure 7:
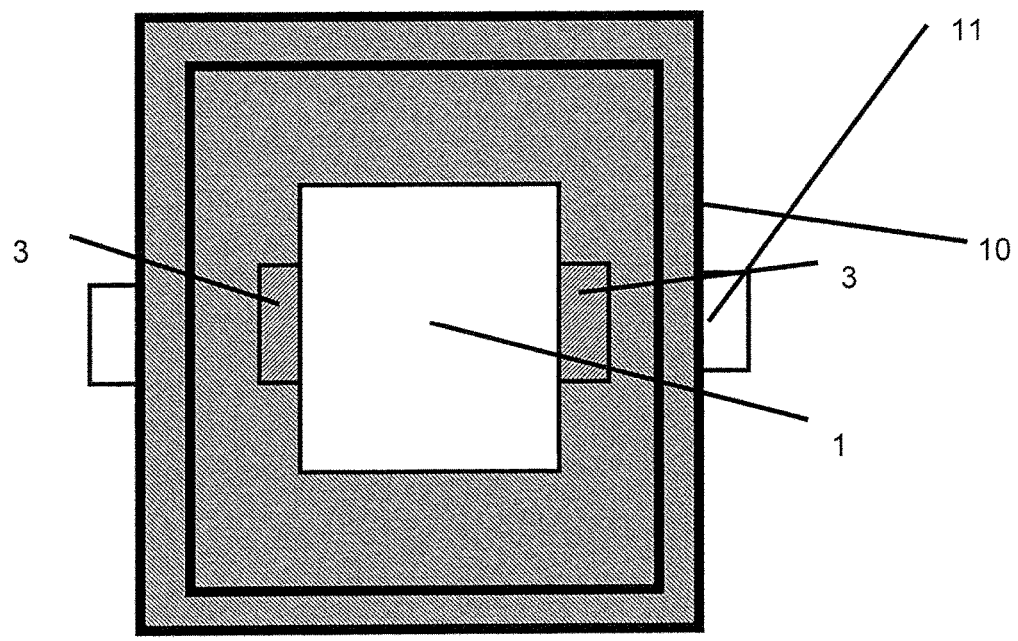

A further example of a radiation-emitting semiconductor device is explained in conjunction with FIG. 7. In this example, the radiation-emitting semiconductor device comprises a single radiation-emitting semiconductor chip 1. By way of example, white light is emitted by the radiation-emitting semiconductor device during operation.

The radiation-emitting semiconductor device thus comprises two chip connection regions 3, which are in each case electrically conductively connected to associated rear-side contact locations (not illustrated) of the semiconductor chip 1. Those locations of the chip connection regions 3 which are not covered by the semiconductor chip 1 are covered with the light-absorbing material 4, as is explained in greater detail, for example, in one of FIGS. 3A, 3B, 3C, 4A, 4B and 4C. A radiation-emitting semiconductor chip 1 having only rear-side contacts as shown in FIG. 7, can in this case also be used in radiation-emitting semiconductor devices comprising two or more radiation-emitting semiconductor chips.

Our devices are not restricted to the examples by the description on the basis of those examples. Rather, this disclosure encompasses any novel feature and also any combination of features, which in particular includes any combination of features in the appended claims, even if the feature or combination itself is not explicitly specified in the claims or examples.

The invention claimed is:

1. A radiation-emitting semiconductor device comprising:
a housing body having a chip mounting area;
a chip connection region;
a radiation-emitting semiconductor chip; and
a light-absorbing material, wherein
the radiation-emitting semiconductor chip is fixed to the chip connection region,
the chip connection region is covered with the light-absorbing material at first selected locations at which said chip connection region is not covered by the radiation-emitting semiconductor chip,
the radiation-emitting semiconductor chip is free of the light-absorbing material in second selected locations,
the housing body has a cavity in which the at least one radiation-emitting semiconductor chip is arranged,
the chip mounting area is a surface of the housing body which abuts the cavity, and
the chip mounting area is free of the light-absorbing material at third selected locations remote from the chip connection region.

2. The device according to claim 1, wherein a wire connection region is arranged at the chip mounting area.

3. The device according to claim 1, wherein the chip mounting area is formed with the same color as, or in a similar color to, the light absorbing material.

4. The device according to claim 1, further comprising a light-transmissive potting material, wherein the potting material is substantially free of the light-absorbing material, and the potting material adjoins the radiation-emitting semiconductor chip and the light-absorbing material in the second selected locations.

5. The device according to claim 4, wherein the potting material abuts the chip mounting area in the second selected locations.

6. The device according to claim 4, wherein the potting material is transparent.

7. The device according to claim 4, wherein the potting material is filled with a phosphor and/or a diffuser.

8. The device according to claim 1, wherein the housing body and the light-absorbing material are the same color.

9. The device according to claim 2, wherein the chip connection region and the wire connection region are formed with a metal.

10. The device according to claim 9, wherein the light-absorbing material inhibits migration and/or oxidation and/or corrosion of the metal.

11. The device according to claim 1, wherein the light-absorbing material comprises a silicone into which light-absorbing particles are introduced.

12. A display apparatus comprising at least one pixel formed at least partly by the device according to claim 1.

13. A method of producing the device according to claim 1 comprising applying the light-absorbing material by a jet process.

14. A radiation-emitting semiconductor device comprising:
a housing body having a chip mounting area;
a wire connection region arranged at the chip mounting area;
a wire electrically conductively connecting the wire connection region to the radiation-emitting semiconductor chip;
a chip connection region;
a radiation-emitting semiconductor chip; and
a light-absorbing material, wherein
the radiation-emitting semiconductor chip is fixed to the chip connection region,
the wire connection region is covered with the light-absorbing material at the first selected locations at which it is not covered by the wire,
the chip connection region is covered with the light-absorbing material at first selected locations at which said chip connection region is not covered by the radiation-emitting semiconductor chip,
the radiation-emitting semiconductor chip is free of the light-absorbing material in second selected locations,
the housing body has a cavity in which the at least one radiation-emitting semiconductor chip is arranged,
the chip mounting area is a surface of the housing body which abuts the cavity, and
the chip mounting area is free of the light-absorbing material at third selected locations remote from the chip connection region.

15. The device according to claim 1, wherein at least 50% of the chip mounting area is free of the light-absorbing material.

16. The device according to claim 1, wherein the light-absorbing material reflects or reemits at most 25% of light that impinges on an outer area of the light-absorbing material.

* * * * *